United States Patent [19]

Nakagawa et al.

[11] Patent Number: 4,946,514
[45] Date of Patent: Aug. 7, 1990

[54] THIN FILM PHOTOELECTROMOTIVE FORCE ELEMENT HAVING MULTI-THIN FILMS STACKED SEMICONDUCTOR LAYER

[75] Inventors: Katsumi Nakagawa, Nagahama; Isamu Shimizu, Yokohama, both of Japan

[73] Assignee: Canon Kabushiki Kaisha, Tokyo, Japan

[21] Appl. No.: 173,579

[22] Filed: Mar. 25, 1988

[30] Foreign Application Priority Data

Mar. 27, 1987 [JP] Japan .................................. 62-73626

[51] Int. Cl.$^5$ .......................................... H01L 31/075
[52] U.S. Cl. ........................................ 136/258; 357/2; 357/4; 357/30
[58] Field of Search ....................... 136/255, 258 AM; 357/15, 30 C, 30 J, 30 K, 2, 4

[56] References Cited

U.S. PATENT DOCUMENTS

| | | | |
|---|---|---|---|
| 4,265,991 | 5/1981 | Hirai et al. | 430/64 |
| 4,365,015 | 12/1982 | Kitajima et al. | 430/62 |
| 4,403,026 | 9/1983 | Shimizu et al. | 430/65 |
| 4,705,912 | 11/1987 | Nakashima et al. | 136/258 |
| 4,718,947 | 1/1988 | Arya | 136/258 |
| 4,719,123 | 1/1988 | Haku et al. | 437/101 |
| 4,721,535 | 1/1988 | Itoh et al. | 136/258 |
| 4,786,574 | 11/1988 | Shirai et al. | 430/66 |

OTHER PUBLICATIONS

K. Takahashi et al, "Amorphons Silicon Solar Cells", J. Wiley and Sons, New York, 1986, pp. 104, 114,118, and 182.

*Primary Examiner*—Aaron Weisstuch
*Attorney, Agent, or Firm*—Fitzpatrick, Cella, Harper & Scinto

[57] ABSTRACT

Improved pin type and Schottky time thin film photo-electromotive force elements which exhibit desired effects in short-circuit current (Isc), open-circuit voltage (Voc), fill factor (F.F.), photoelectric conversion efficiency and S/N ratio, characterized in that at least one of the n-type semiconductor layer and the p-type semiconductor layer is constituted with a non-single-crystal silicon semiconductor layer comprised of a plurality of stacked non-single-crystal silicon films of 100 Å or less thickness containing 1 to 10 atomic % of hydrogen atoms.

1 Claim, 6 Drawing Sheets

THIN FILM PHOTOELECTROMOTIVE FORCE ELEMENT HAVING MULTI-THIN FILMS STACKED SEMICONDUCTOR LAYER

FIELD OF THE INVENTION

The present invention relates to an improved thin film photoelectromotive force element having a high photoelectric conversion efficiency which is usable as solar cell or photosensor.

BACKGROUND OF THE INVENTION

Solar cells are expected as an electric source of the next generation and more particularly, as a diffusion installation type electric source from the viewpoints that it uses the unexhaustible sun light as its energy source, and it hardly affects the surroundings, it operates efficiently even in the case where it is of a small size, and its maintenance is easy. There have been proposed a number of photoelectromotive force members to be used for solar power generation. And it has been reported that there will be obtained a photoelectric conversion efficiency of more than 20% in the case where a crystal of Si or GaAs is used as its constituent semiconductive layer. However, such photoelectromotive force members are very costly and therefore, the cost of electric power unavoidably becomes higher than that obtained by other electric power generating means, because these devices have not yet come to practical use. On the other hand, as for thin film photoelectromotive force elements such as amorphous silicon pin type, Schottky type and CdS-CdTe heterojunction type, cost reduction of the element itself can be anticipated, but its photoelectric conversion efficiency has not come to exceed 10% on a practical scale, and the cost required for the installation becomes rather high, and accordingly, it is impossible to sufficiently reduce the price of the electric power. Various proposals for increasing the photoelectric conversion efficiency of a thin film photoelectromotive force element have been made to improve the situation.

In one such proposal, for the thin film photoelectromotive force element, one of the constituent n-type and p type thin film semiconductor layers is constituted with a 100 Å or less thick semiconductor thin film containing an impurity and another semiconductor thin film of less than 100 Å in thickness containing said impurity in a different concentration from the above, or a different impurity or layers containing the different impurities being repeatedly laminated.

This proposal will be explained with reference to FIG. 1. FIG. 1 is a schematic cross-sectional view of a pin type A Si:H thin film photoelectromotive force element to which the above proposal has been applied. In FIG. 1, there are shown a metallic substrate 1 such as a stainless steel plate having a polished surface, a plurality of n-type 50 Å A thick A-Si:H film layers 2 formed using $PH_3$ alternately stacked with a corresponding plurality of 50 Å thick A-Si:H film layers 3 formed not using said $PH_3$, a 5000 Å thick A-Si:H film layer 4 not containing any impurity, a plurality of p-type 50 Å thick A Si:H film layers 5 formed using $B_2H_6$, alternately stacked with a corresponding plurality of a 50 Å thick A-Si:H film layers 6 formed not using said $B_2H_6$, a transparent electroconductive layer 7 such as an ITO film and a collector electrode 8, for example, made of silver.

By employing this stacked structure, the short-circuit current (Isc) can be made larger than that of the conventional pin type photoelectromotive force element shown in FIG. 2. This seems to be due to that in the element shown in FIG. 2, the photons absorbed in the n-type thin film semiconductor layer 22 or the p-type thin film semiconductor layer 26 scarcely generate electrons and holes, and on the other hand, in the element shown in FIG. 1, the electrons and holes can be effectively generated in the stacked structure of n-type and p-type thin film semiconductor layers. However, even in the case of the element in FIG. 1, improvements in the open circuit voltage (Voc) and the fill factor (F.F.) are not sufficient, and it is not possible to remarkably increase the photoelectric conversion efficiency. In addition, in the case where the above proposal is applied to a photosensor with reverse bias voltage, it is preferable that the dark current (corresponding to the saturation current of a diode) be as small as possible, since in that case, the S/N ratio may be increased and as a result, the range of the luminous intensity required for a photosensor, may be extended. However, at present the devices have not yet come to sufficiently satisfy the practical demands.

SUMMARY OF THE INVENTION

The present inventors have conducted extensive studies in order to solve the problems in the known thin film photoelectromotive force elements and to develop a desired thin film photoelectromotive force element having an improved photoelectric conversion efficiency and which is effectively usable as solar cell, photosensor and the like.

As a result, the present inventors have discovered a desirable semiconductor layer comprised of a plurality of stacked non single crystal silicon semiconductor thin films respectively, containing 1 to 10 atomic % of hydrogen atoms, which is suited for use as a constituent semiconductor layer in a photoelectromotive force element and which makes the resultant photoelectromotive force element free from the foregoing problems, which are found on the conventional photoelectromotive force element.

It is therefore an object of the present invention to provide an improved thin film photoelectromotive force element which exhibits desired effects in short circuit current (Isc), open circuit voltage (Voc) and fill factor (F.F.), which also exhibits a high photoelectric conversion efficiency, and which further exhibits an improved S/N ration when it is used as a photosensor.

Another object of the present invention is to provide an improved thin film photoelectromotive force element having an improved non-single-crystal silicon semiconductor layer comprised of a plurality of stacked non-single crystal silicon thin films respectively containing 1 to 10 atomic % of hydrogen atoms, as at least one of its constituent semiconductor layers and which exhibits the foregoing effects.

A further object of the present invention is to provide a process for the preparation of the aforesaid thin film photoelectric conversion element.

DESCRIPTION OF THE INVENTION

The present invention has been accomplished based on the below mentioned findings obtained as a result of extensive studies by the present inventors in order to attain the foregoing objects.

According to one aspect of the present invention, there is provided an improved pin type thin film photoelectromotive force element, characterized in that at least one of the constituent n-type and p-type semiconductor layers is constituted by a non-single-crystal semiconductor layer formed by stacking two or more times two or more of the following non-single-crystal silicon films of 100 Å or less thickness containing 1 to 10 atomic % of hydrogen atoms: (i) a non-single-crystal silicon thin film containing an impurity (a); (ii) a non-single-crystal silicon thin film containing said impurity (a) in an amount larger than that in said thin film (i); (iii) a non-single-crystal silicon thin film containing a different impurity (b) and (iv) a non-single-crystal silicon thin film not containing any impurity.

According to another aspect of the present invention there is provided a Schottky type thin film photoelectromotive force element, characterized in that the n-type semiconductor layer or the p-type semiconductor layer is constituted with the aforesaid multi-thin films stacked semiconductor layer.

These photoelectromotive force elements according to the present invention have been realized on the basis of the findings obtained as a result of repeated experiments by the present inventors showing that the concentration of hydrogen atoms contained in the p-type semiconductor layer or the n-type semiconductor layer is an important factor for eliminating the foregoing problems which are found on the conventional photoelectromotive force elements, and in the case where at least one of said p-type and n-type semiconductor layers is constituted by a stacked non single-crystal silicon layer comprised of a plurality of 100 Å or less thick non-single-crystal silicon semiconductor films, the aforesaid objects of the present invention can be effectively attained.

Figure 1:
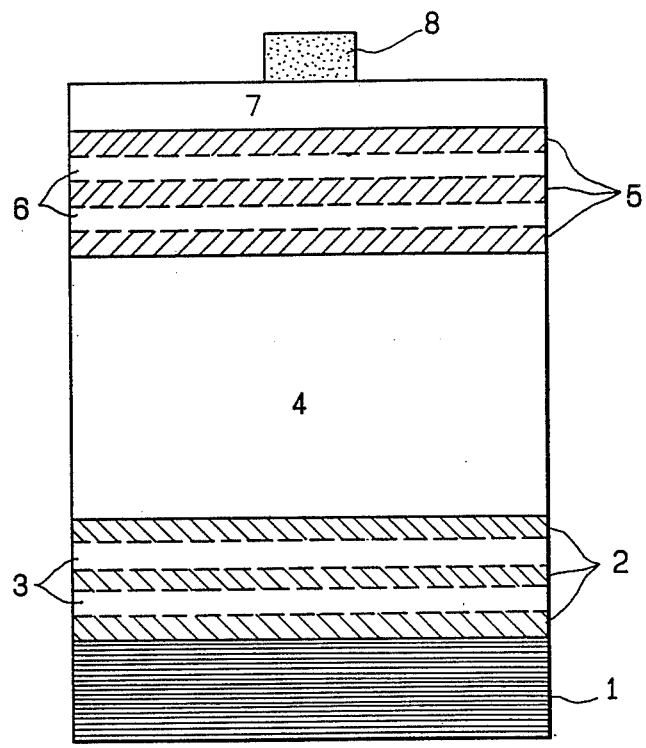
FIG. 1 is a schematic cross-sectional view of the pin type thin film photoelectromotive force element according to the present invention, which also serves to illustrate a conventional pin type thin film photoelectromotive force elements.
Figure 2:
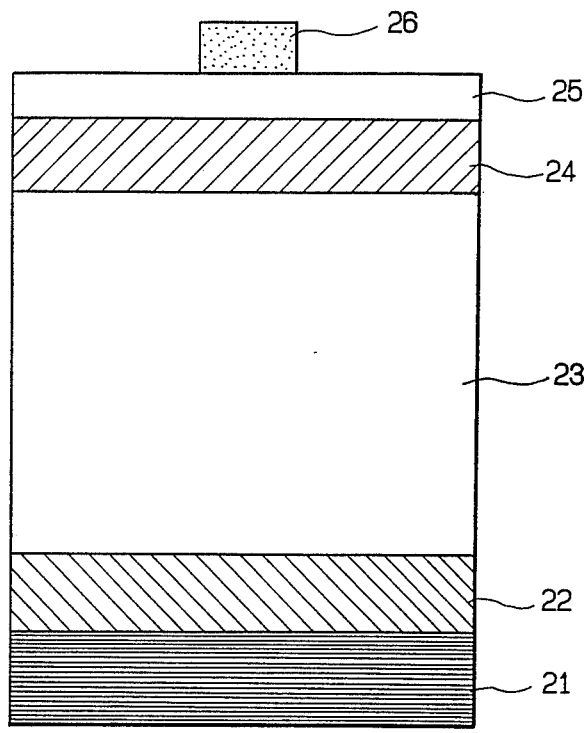
FIG. 2 is a schematic cross-sectional view of a conventional pin type photoelectromotive force member not using laminated thin film semiconductors for the p- and n-layers.

A typical pin type photoelectromotive force element according to the present invention is of the type as shown in FIG. 1, in which were shown a metallic substrate 1 such as a stainless steel plate 1, a plurality of p-type non-single-crystal silicon semiconductor thin film layers 2 alternately stacked with a plurality of i-type non-single-crystal silicon semiconductor layers 3 not containing any impurity, an i-type non-single-crystal silicon semiconductor layers 4, a plurality of n-type non-single-crystal silicon semiconductor thin film layers 5 alternately stacked with a plurality of i-type non-single-crystal silicon semiconductor thin film layers 6, a transparent electrode 7 constituted by a transparent layer such as $In_2O_3$, $SnO_2$, ITO or ZnO layers, and a collector electrode 8.

Figure 5:
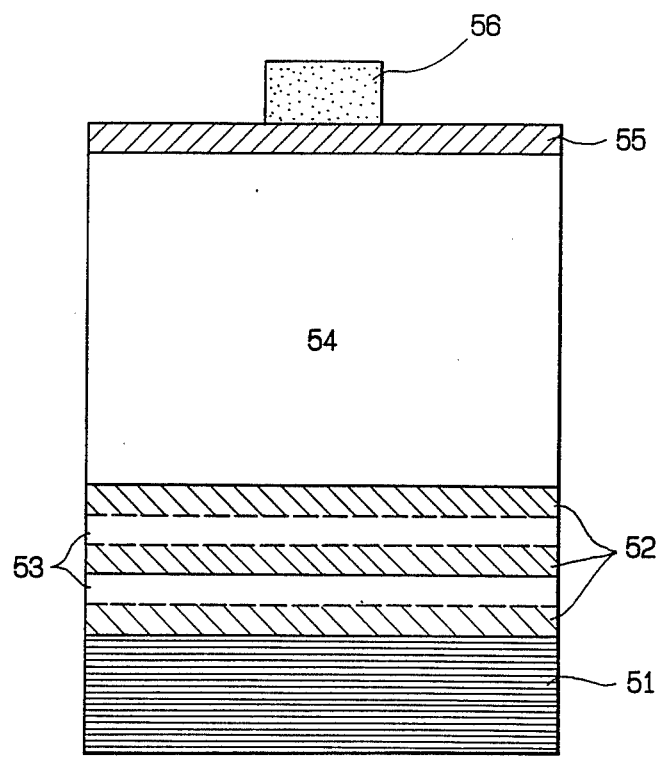
FIG. 5 is a schematic cross-sectional view of a Schottky type thin film photoelectromotive force element according to the present invention.

A typical Schottky type thin film photoelectromotive element according to the present invention is of the type as shown in FIG. 5, in which are shown a metallic substrate 51 such as a stainless steel plate, a plurality of p-type non-single-crystal silicon semiconductor thin film layers 52 alternately stacked with a plurality of i-type non-single-crystal silicon semiconductor thin film layers 53 not containing any impurity, an i-type non-single-crystal silicon semiconductor layers 54, a transparent Schottky electrode 55 constituted by a transparent layer such as Au, Pt and Pd, and a collector electrode 56. A plurality of n-type non-single-crystal silicon semiconductor thin film layers 52 alternately stacked with a plurality of undoped non-single-crystal silicon thin film layers may be used instead of the p-type non-single-crystal silicon semiconductor layer.

EXPERIMENTS

The present inventors have conducted the following experiments in order to confirm the superiority of the photoelectromotive force element according to the present invention.

(1) Preparation of Samples

Figure 3:
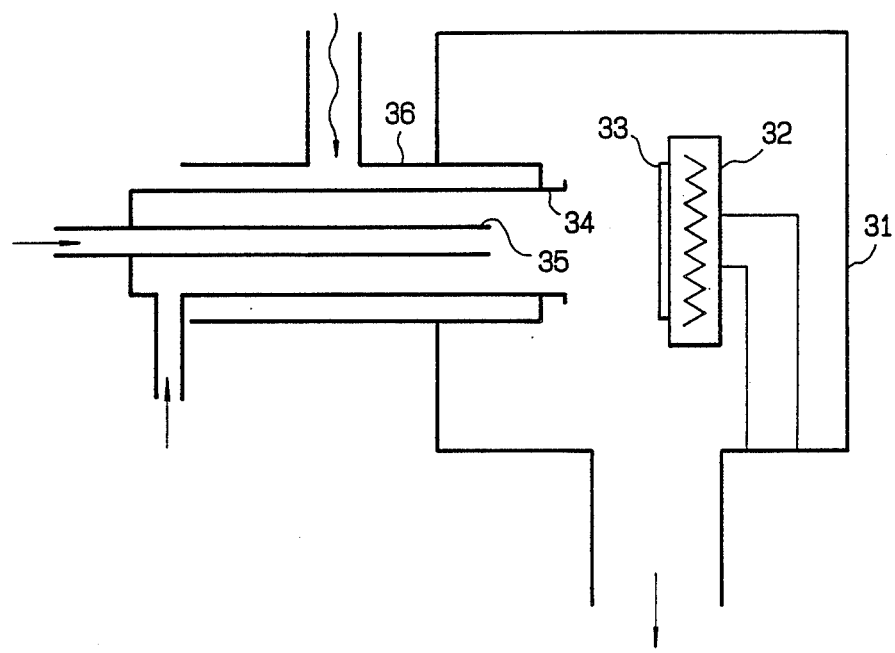
FIG. 3 is a schematic explanatory view of a film forming apparatus according to HR-CVD method (hydrogen radical assisted CVD method) which is used for the tests to show the effects of the present invention and for the preparation of photoelectromotive force elements in Examples 1–3 of the present invention.

There was used a known HR-CVD apparatus shown in FIG. 3 in order to prepare samples to be examined.

In FIG. 3, 31 is a vacuum chamber, the inside of which can be evacuated by a vacuum pump (not shown). In the vacuum chamber is installed a substrate holder 32 for a substrate 33. The substrate 33 can be heated to a desired temperature by an electric heater installed in the substrate holder 32. To the vacuum chamber 31, there is connected a double conduit comprising a cylindrical quartz glass outer pipe 34 and a cylindrical quartz glass inner pipe 35 being concentrically arranged. On the outer wall face of the double conduit there is provided an applicator 36 for applying microwave energy source into the spaces of said outer and inner pipes to thereby activate raw material gases introduced therein. The resulting active species successively enter into the reaction space of the vacuum chamber 31 for chemical reactions amongst themselves, resulting in the formation of a deposited film on the substrate 33. Using this apparatus, three kinds of thin film semiconductors were prepared under the conditions shown in Table 1. The term "x" in Table 1 is given to experiments with varying value of discharge power.

(2) Experiments to demonstrate the effects when a plurality of thin films are stacked The following samples were prepared to evaluate the effects caused by stacking thin films. A 500 Å thick amorphous silicon nitride layer (hereinafter abbreviated as "A-SiN layer") was deposited on a Corning No. 7059 glass plate (whose surface was coated an ITO film) by glow discharge in a gaseous mixture of $SiH_4$ $NH_3$. Then, there was deposited a 300 Å thick n-type silicon layer under the conditions A (x=160W) in Table 1. Successively, there was deposited a 3 μm thick amorphous silicon layer under the conditions B in Table 1. Then, a 500 Å thick A-SiN layer was deposited, and then, an Al film was vapor deposited on the surface of said A-SiN layer to form a surface electrode. This sample was identified as Sample (N-1). Sample (P-1) was prepared in a similar manner to Sample (N-1), except that in place of the n-type silicon layer, a 300 Å thick p-type silicon layer was deposited under the conditions C in Table 1.

Then, a 500 Å thick A-SiN layer was deposited on a similar Corning 7059 glass plate (whose surface was coated with an ITO film) and under the conditions B (x=160 W), there were successively deposited a 25 Å thick i-type amorphous silicon layer, a 25 Å thick n-type amorphous silicon layer and a 25 Å thick i-type amorphous silicon layer and a 25 Å thick n-type amorphous silicon layer were repeatedly deposited 12 times to prepare a 600 Å thick laminated semiconductor layer. On the surface of the thus formed semiconductor layer, there were successively deposited a 3 $\mu$m thick i-type amorphous silicon layer, then a 500 Å thick A-SiN layer. Finally, there was formed a Al surface electrode. This sample was identified as Sample (N-2).

Sample (P-2) was prepared in the same way as the Sample (N-2) except that in place of the n-type silicon, a 25 Å thick p-type amorphous silicon layer was deposited under conditions C (x=160 W) in Table 1.

In a similar manner, there were prepared Samples (N-3), (P-3), (N-4), (N-5) and (P-5), except that the layer thickness L was respectively made 50 Å, 100 Å and 150 Å, and the repetition of n-type layer and i-type layer or the repetition of p-type layer and i-type layer was conducted 6 times, 3 times and 2 times, respectively.

Figure 4:
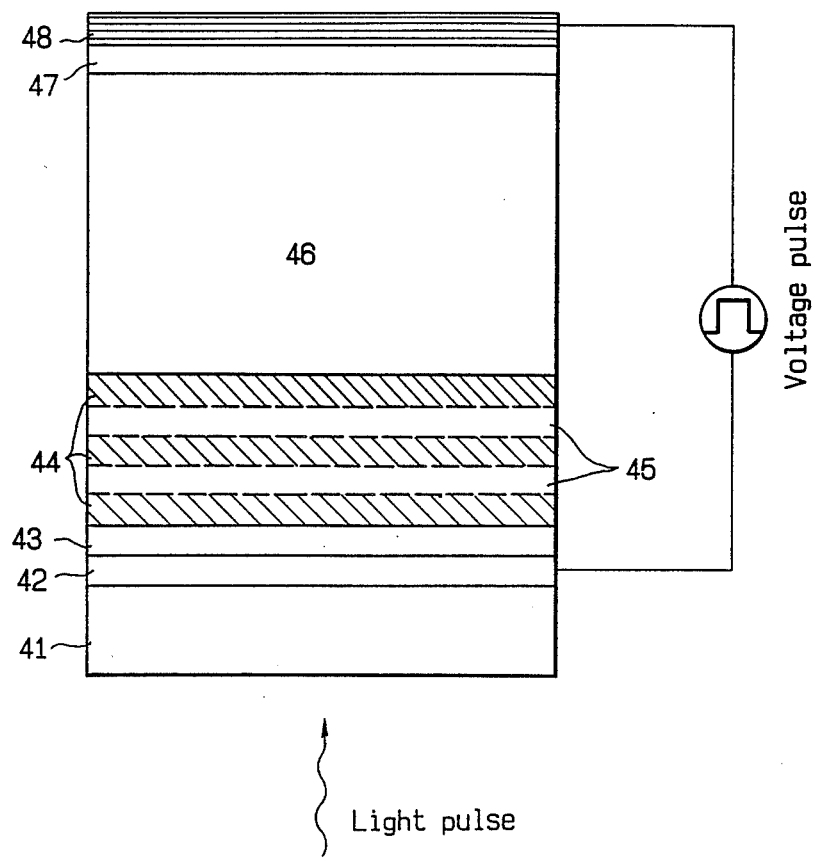
FIG. 4 is an explanatory view to illustrate the experiment according to the TOF method, among others, to show the effects of the present invention.

Time of Flight (TOF) measurement was made on the thus prepared samples. FIG. 4 shows the set-up of this measurement, which shows the case when Samples (N-4) or (P-4) was used. Here, 41 is a glass plate, which is coated with an ITO film 42 and 43, 47 are A-SiN layers. The A-SiN layers are inserted to inhibit the injection of electrons and holes from the electrodes. 44 is a n-type layer or p-type layer, and 45, 46 are i-type layers. 48 is an aluminum electrode film. Since the final i-type layer is under the same conditions with the subsequently deposited i-type layer, distinction between them is not done in FIG. 4. The measurement procedure is illustrated in the case where the laminated film semiconductor is constituted from an n-type layer and an i-type layer. A pulsed voltage signal is applied in the dark between the ITO film 42 and the Al film 48 in such manner that the ITO film is positive, and thereafter, a pulse from a dye laser activated by a nitrogen laser is applied to the glass plate 41. Since the wavelength of the incident laser light is as short as 460 nm, almost all of the light is absorbed at the laminated thin film semiconductor (the n-type layer and p-type layer, respectively, in samples (N-1) and (P-1)). The holes therein generated drift to the Al film 48 due to the built-in electric field, and the electric current flows into an external circuit The number of holes flowing through the film can be determined by integrating this electric current. If the holes generated at the stacked thin film semiconductor layer recombine with each other, the Q value of the integrated electric current decreases, and using this measurement the degree of recombination of the holes in the stacked thin film semiconductor layer can be evaluated. In the case when the stacked thin film semiconductor layer is constituted from p-type layers and i-type layers the degree of the recombination of electrons in the stacked thin film semiconductor layer can be evaluated by applying the pulsed voltage signal in such manner that the Al film 48 is positive.

Table 2 shows the relative Q value of the integrated electric current of each sample. As is apparent, in the case when the sum of the thicknesses of the n-type layers or p-type layers in the stacked thin film layer is 300 Å, Q (relative value) is 5 or more if the thickness of a single layer (L) is 100 Å or less, and it has been found that rates of recombination of holes and electrons decrease remarkably in both cases when n-type layers and p-type layers are used for the stacked thin film semiconductor layer. From this, it can be anticipated that when the stacked thin film conductor layer is used for the n-type layer of the pin type photoelectromotive force element, a decreased amount of holes generated in said semiconductor or near the stacked thin film semiconductor layer in the i-type layer recombine resulting in an increase of the short-circuit photoelectric current Isc of the photoelectromotive force element.

Similarly, it is anticipated that when the stacked thin film semiconductor is used for the p-type layer, the amount of recombination of electrons generated in said semiconductor or near the stacked thin film semiconductor in the i-type layer, also decreases, contributing to the increase of Isc. The mechanism to generate this effect seems to be due to the distribution of electrons and holes in the recombination centers in the n-type or p-type layers, particularly at the part adjacent to the i-type layer, in the stacked thin film semiconductor layer, is changed Accordingly, although not distinct, similar effects can be expected even if the number of repetition is two, so long as L is 100 Å or less, in view of said mechanism.

From the above experimental results and considerations it is anticipated that when the stacked thin film semiconductor layer is used as an n-type layer or p-type layer of the photoelectromotive force element, short circuit current Isc of the photoelectromotive force element can be increased by making the single layer thickness L 100 Å or less and making the number of repetitions two or more.

(3) Experiments to demonstrate the effects due to the concentration of hydrogen atoms to be contained The following experiment was carried out to show that the hydrogen content in the film can be controlled by the HR-CVD method as illustrated in (i). An n-type film, an i-type film and a p-type film, with thickness of 1 $\mu$, are formed on undoped Si wafer substrates (thickness 500 $\mu$), at a microwave discharge electric power x=600 W under the conditions A, B and C in Table 1, respectively, to prepare the samples (N-6), (I-6) and (P-6), respectively.

Similarly, the microwave electric power x is made 80 W, 100 W, 120 W, 160 W and 200 W, and Samples (N-7), (I-7), (P-7) to (N-11), (I-11), (P-11) are prepared, respectively.

Using a Fourier transform infrared absorption (FTIR) apparatus, the hydrogen atom content of each sample is determined by the absorption strength of the Si-H stretching mode which is present in the region 200 cm$^{-1}$ to 2100 cm$^{-1}$ in the absorption spectrum. The results are shown in Table 3.

The sample was prepared in the following manner to evaluate the electroconductivity of the multilayer film when the hydrogen atom content was changed.

The n-type layer 50 Å is deposited on a Corning No. 7059 glass plate by means of the HR-CVD method at a microwave electric power x=60 W under the conditions A in Table 1. Thereafter, a deposition cycle of the i-type layer 50 Å, the n-type layer 50 Å and the i-type layer 50 Å in this order, is repeated 100 times to obtain a total deposition thickness of 1 μ. After that, the obtained sample is evaporated with Al metal using a permalloy mask to prepare the comb type electrode. This was identified as Sample (N-12). Sample (P-12) was prepared like the Sample (N-12), except that in place of the n-type layer a p-type layer was deposited at x=60 W under the conditions C shown in Table 1. Further, the Samples (N-13), (P-13); (N-14), (P-14); (N-15), (P-15); (N-16), (P-16); and (N-17), (P-17), are prepared like the Samples (N-12) and (P-12), at 80 W, 100 W, 120 W and 200 W, respectively.

The thus prepared samples were evaluated by measuring the electric conductivity in the dark, $^{94}$ d. The results are shown in Table 4. Comparison of Table 3 with Table 4 shows that decreases occur in dark electrical conductivity remarkably in both cases when n-type layer and p-type layer are used for the stacked thin film semiconductor layer, as the hydrogen atom content exceeds 10%. This difference seems to be due to the difference in concentration of electrons in case when n-type layer is used for the stacked thin film semi-conductor layer and to be due to the difference in concentration of holes in case when p-type layer is used for the stacked thin film semiconductor. In the pin-type photoelectromotive force element, the n-type layer or the p-type layer are more difficult to be converted to a depleted layer as electron concentration of the n-type layer or the electron concentration of the p-type layer becomes higher, and high open circuit voltage Voc is obtained since the potential difference at the depleted region is less. In addition, the fill factor F.F. becomes larger, since the electric field strength in the i-type layer between the p-type layer and the n-type layer is increased.

From the above results of the Experiments (1) and (2), a great increase in the conversion efficiency is expected for the pin-type photoelectromotive force element using the silicon thin film semiconductors, by repeatedly depositing a p-type layer with thickness of 100 Å or less and an i-type layer with thickness of 100 Å or less (hereinafter called p-type stacked thin film semiconductor), or a n-type layer with thickness of 100 Å or less and an i-type layer with thickness of 100 Å or less (hereinafter called n-type stacked thin film semiconductor), at least 2 times and by regulating the hydrogen atom content in the layer to 10 atomic % or less.

When using a photoelectromotive force element as a photosensor, the diode saturation current is required to be small, as described above. And, as is well known, a photoelectromotive force device showing a high open circuit voltage Voc has generally a small saturation current, so the present photoelectromotive force element is expected to show excellent characteristics as a photosensor.

In the following Examples of the present invention, the present invention shows excellent practical characteristics as a photoelectromotive force element or photosensor. In addition, the features of the present invention may be applied to not only photoelectromotive force elements of pin-type but also to other thin film semiconductors containing Si as the main constituent.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

In this Example, there are prepared a plurality of photoelectromotive force element samples in accordance with the known HR-CVD method using the fabrication apparatus shown in FIG. 3.

A stainless substrate of 50 mm×50 mm in size was placed in a conventional reactive sputtering apparatus (not shown) and there was deposited thereon an about 1000 Å thick Ag layer as a bottom electrode.

Then, the thus prepared substrate was firmly attached to the surface of the substrate holder 32 in the fabrication apparatus shown in FIG. 3. Then, the heater was actuated to uniformly heat the substrate to about 300° C., and it was kept at this temperature.

Then, the vacuum chamber 31 was evacuated to a vacuum of about $10^{-5}$ Torr. Successively, Ar gas and $H_2$ gas were fed through the outer pipe 34 into the vacuum chamber at respective flow rates of 250 SCCM and 20 SCCM. Concurrently $SiF_4$ gas and $PF_5/SiF_4$ (=1%) gas were fed through the inner pipe 35 into the vacuum chamber. After the flow rates of the above gases became stable, the inner pressure was adjusted to a vacuum of about 0.5 Torr. Thereafter, microwave energy of 160 W (2.45 GHz) was applied through the applicator 36 into the double conduit. There was formed a 150 Å thick n-type amorphous silicon semiconductor layer. (This film forming condition corresponds to the condition A (x=1600 W) in Table 1).

Then, terminating the introduction of the microwave energy source and also the introduction of the $PF_5$ gas, the flow rate of the $SiF_4$ gas was changed to 30 SCCM and microwave energy of 160 W (2.45 GHz) was applied to the double conduit to thereby form a 500 Å thick i-type amorphous silicon semiconductor layer on the previously formed n-type layer. (This film forming condition corresponds to the condition B (x=160 W) in Table 1).

Terminating the introduction of the microwave energy source, the flow rate of the $SiF_4$ was changed to 27 SCCM, $BF_3/SiF_4$ (=1%) gas was fed at a flow rate 3 SCCM, and then there was applied microwave energy of 160 W to thereby form a 150 Å thick p-type amorphous silicon semiconductor layer. (This film forming condition corresponds to the condition C (x=160 W) in Table 1).

Thereafter, the resulting laminate was removed from the vacuum chamber, and placed in a conventional vacuum evaporation apparatus (not shown). In particles and Sn particles were placed in a crucible in the weight ratio of 1:1, and in accordance with a conventional resistance heating method and in an oxygen atmosphere of about $1 \times 10^{-3}$ Torr, there was formed an about 700 Å ITO layer as a transparent electrode while maintaining the substrate at 175° C.

After the resultant laminate was cooled to room temperature, it was removed from the apparatus. Then, a permalloy mask was placed on the previously formed ITO transparent electrode, and it was introduced into another conventional vacuum evaporation apparatus to form an about 1.0 μm thick Ag comb type collector in accordance with a conventional resistance heating method at a vacuum of $1 \times 10^{-5}$ Torr.

In this way, there was obtained a pin-type thin film photoelectromotive force element (Sample V-1). In accordance with the above procedures, there was firstly formed on a substrate of the same kind as the above an n-type amorphous silicon semiconductor layer by repeating three times the film forming procedure to form a 50 Å thick amorphous silicon semiconductor layer (film) under the condition A (x=600 W) in Table 1 and the film forming procedure to form a 50 Å thick amorphous silicon semiconductor layer (film) under the condition B (x=600) in Table 1. Then, there was formed a 5000 Å thick i-type amorphous silicon semiconductor layer under the condition B (x=160 W) in Table 1. Successively, there was formed a p-type amorphous silicon semiconductor layer by repeating three times the procedures to form a 50 Å thick amorphous silicon semiconductor layer (film) under the condition B (x=600 W) in Table 1 and the procedures to form a 50 Å thick amorphous silicon semiconductor layer (film) under the condition C (x=600 W) in Table 1.

Thereafter, there were formed an ITO layer (transparent electrode) and a Ag comb type electrode by repeating the procedures in the case of preparing Sample V-1.

In this way, there was obtained another pin-type thin film photoelectromotive element (Sample PV-2).

The procedures for the preparation of Sample V-2 were repeated, except that the power of the microwave energy source in the case of forming a multi-thin film stacked n-type amorphous silicon semiconductor layers and a multi-thin film stacked p-type amorphous silicon semiconductor layers were adjusted respectively to 80 W, to thereby prepare a pin-type thin film photoelectromotive element (Sample PV-3).

Likewise, there were prepared Samples PV-4, PV-5, PV-6 and PV-7 with respective microwave energy powers of 100 W, 120 W, 160 W and 200 W.

Every sample was irradiated with AM-1 light (100 mV/cn²) from the ITO film side, and there were measured short-circuit photoelectric current (Isc), open circuit voltage (Voc), fill factor (F.F.) and photoelectric conversion efficiency (n) thereof. The results obtained were as shown in Table 5.

As Table 5 illustrates, since the n-type thin film semiconductor layer and the p-type thin film semiconductor layer in the Sample PV-1 are not of multi-thin films stacked structure, the values of Isc, Voc, F.F. and η are all the lowest.

All the Samples PV-2 to PV-7 are of a multi-thin film stacked structure for their n-type and p-type amorphous silicon semiconductor layers, and when compared to the results shown in Table 3, the Samples PV-5 to PV-7 are out of the range of the present invention since the concentration of hydrogen atoms in the n-type and/or p-type amorphous silicon semiconductor layers exceeds 10 atomic %. Although these Samples have a large Isc, Voc, F.F. and η are still low. Tho Samples (PV-2)-(PV-4) where the hydrogen atom content in the stacked structure for thin semiconductor layer is 10% or less have higher Voc and F.F. and show sufficiently good characteristics, and from this the effect of the present invention is confirmed.

In Table 6 are shown the dark electric current when the Samples (PV-1) (PV-7) are applied with −5 V reverse bias, the photoelectric current when the Samples are irradiated with 100 lux light, and the ratio of them (S/N) Four or more figures for S/N are obtained with the Samples (PV-2)-(PV-4) where the hydrogen atom content is 10% or less, and these samples have sufficient dynamic range for practical use as a photosensor whereas the S/N is low with the Samples (PV-1) and (PV-5)-(PV-7). So, from Table 6 the effect of the present invention is confirmed.

EXAMPLE 2

Thin film electromotive force elements (PV-8), (PV-9) shown in FIG. 1 are prepared using an apparatus shown in FIG. 3 in a similar manner as in Example 1, except that a p-type SiC thin film semiconductor is prepared under the conditions D in Table 7 and a p-type stacked thin semiconductor layer is prepared by depositing the SiC thin film semiconductors not containing an impurity inserted between them, under the conditions E. (PV-8) is a comparison example, and (PV-9) is an example of the present invention. The characteristics of these as a solar cell and the characteristics as a photosensor (the ratio of the photoelectric current when −5V reverse bias electric potential is applied under irradiation with 100 lux light to the dark electric current =S/N) are shown in Table 8.

As shown in Table 8, in Example (PV-9) where the p-type SiC stacked thin semiconductor layer is used, the hydrogen concentration in the p-type stacked thin semiconductor layer is 10 atomic % or less, and the sample shows good solar cell and photosensor characteristics. On the other hand, the comparison example (PV-8) is inferior to the example (PV-9) in each characteristic.

EXAMPLE 3

Schottky type thin film photoelectromotive force elements (PV-10), (PV-11) shown in FIG. 5, are prepared using an apparatus shown in FIG. 3. (PV-10) is a comparison example and (PV-11) is an example of the present invention. Here, 51, 52, 53, 54 and 56 in FIG. 5 correspond to 1, 2, 3, 4 and 6 in FIG. 1, respectively. 55 is semi-transparent gold film with thickness of 50 Å formed by vacuum vapor deposition by means of the resistance heating method. The characteristics as a solar cell and as a photosensor of these Schottky type thin film photoelectromotive force elements (PV-10) and (PV-11), are shown in Table 9.

As is apparent from Table 9, even in the case of a Schottky type electromotive force element, the example (PV-11) where the hydrogen content is 10 atomic % or less shows good solar cell and photosensor characteristics. On the other hand, the comparison example (PV-10) where the hydrogen content exceeds 10 atomic % is inferior to said example in each characteristic.

EXAMPLE 4

Figure 6:
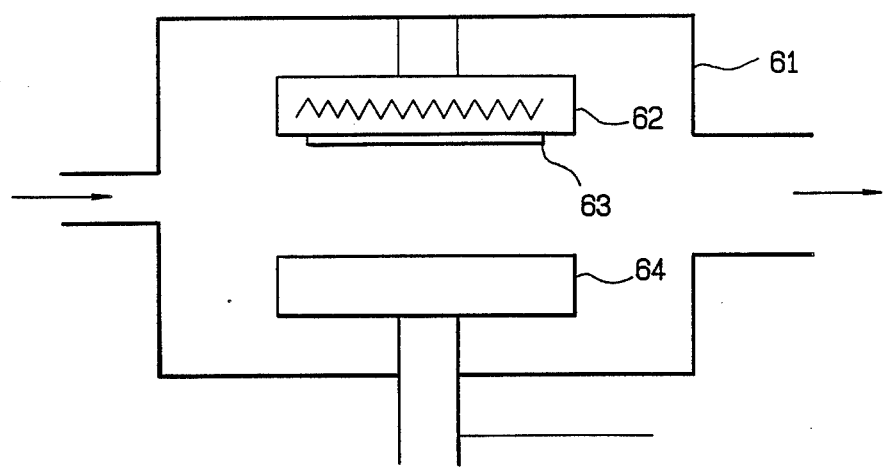
FIG. 6 is a schematic explanatory view of a film forming apparatus using a high frequency electric power source for the preparation of the elements in Example 4.

Pin-type thin film photoelectromotive force elements (PV-12) and (PV-13) shown in FIG. 1 are prepared using an apparatus shown in FIG. 6. (PV-12) is a comparison example and (PV-13) is an example of the present invention. In FIG. 6, a vacuum chamber 61 is evacuated by a vacuum pump. A grounded substrate holder 62 is installed therein, and a substrate 63 is fixed thereon. The substrate 63 can be heated to a desired temperature by a heater installed in the substrate holder 62. A cathode electrode 64 is positioned opposite the substrate holder 62. A starting material gas introduced into a vacuum chamber 61 is decomposed by 13.56 MHz high-frequency electric power applied to a cathode electrode 64, to deposit a thin film semiconductor on the substrate 63. Using this apparatus, five kinds of thin film semiconductors are prepared under the preparation conditions shown in Table 10.

That is, layer 2 in FIG. 1 is prepared under conditions F in Table 10, layer 3 is prepared under conditions G, layer 4 is prepared under conditions H, layer 5 is prepared under conditions I and layer 6 is prepared under conditions J. The characteristics as a solar cell and as a photosensor of thus obtained thin film photoelectromotive force elements, are shown in Table 11.

As is apparent from Table 11, even in the case of the RF glow discharge method where SiH$_4$ gas is used, the example (PV-13) where the hydrogen content is 10 atomic % or less show both good solar cell and photosensor characteristics. On the other hand, the comparison example (PV-12) where hydrogen content exceeds 10 atomic % is inferior to said example in each characteristic.

That is, it has been found that good characteristics as a solar cell and a photosensor are obtained by controlling the hydrogen concentration.

TABLE 1

|  | A |  | B |  | C |  |
|---|---|---|---|---|---|---|
| Inner pipe | SiF$_4$ | 30 SCCM | SiF$_4$ | 30 SCCM | SiF$_4$ | 30 SCCM |
|  | PF$_5$ | 0.03 SCCM |  |  | BF$_5$ | 0.03 SCCM |
| Outer pipe | Ar | 250 SCCM | Ar | 250 SCCM | Ar | 250 SCCM |
|  | H$_2$ | 20 SCCM | H$_2$ | 20 SCCM | H$_2$ | 20 SCCM |
| Inner pressure |  | 0.5 Torr |  | 0.5 Torr |  | 0.5 Torr |
| Discharge power |  | XW |  | XW |  | XW |
| Substrate temperature |  | 300° C. |  | 300° C. |  | 300° C. |

TABLE 2

| Sample No. | L | Number of repetition (times) | Q (Relative value) |
|---|---|---|---|
| N-1 | Single layer | — | 1.0 |
| N-2 | 25A | 12 | 15.7 |
| N-3 | 50A | 6 | 12.3 |
| N-4 | 100A | 3 | 6.2 |
| N-5 | 150A | 2 | 1.4 |
| p-1 | Single layer | — | 1.0 |
| p-2 | 25A | 12 | 13.4 |
| p-3 | 50A | 6 | 10.5 |
| p-4 | 100A | 3 | 5.9 |
| p-5 | 150A | 2 | 1.2 |

TABLE 3

| Microwave power | Sample No. | Hydrogen content (atomic %) | Sample No. | Hydrogen content (atomic %) | Sample No. | Hydrogen content (atomic %) |
|---|---|---|---|---|---|---|
| 60 W | N-6 | 2 | I-6 | 2 | P-6 | 2 |
| 80 W | N-7 | 4 | I-7 | 4 | P-7 | 4 |
| 100 W | N-8 | 9 | I-8 | 9 | P-8 | 8 |
| 120 W | N-9 | 12 | I-9 | 12 | P-9 | 11 |
| 160 W | N-10 | 15 | I-10 | 15 | P-10 | 13 |
| 200 W | N-11 | 17 | I-11 | 17 | P-11 | 15 |

TABLE 4

| Microwave power | Sample No. | σd | Sample No. | σd |
|---|---|---|---|---|
| 60 W | N-12 | $1.2 \times 10^1$ | P-12 | 3.5 |
| 80 W | N-13 | 4.2 | P-13 | $7.9 \times 10^{-1}$ |
| 100 W | N-14 | $8.4 \times 10^{-1}$ | P-14 | $1.4 \times 10^{-1}$ |
| 120 W | N-15 | $1.7 \times 10^{-2}$ | P-15 | $5.3 \times 10^{-3}$ |
| 160 W | N-16 | $2.4 \times 10^{-3}$ | P-16 | $9.4 \times 10^{-4}$ |
| 200 W | N-17 | $3.2 \times 10^{-4}$ | P-17 | $1.1 \times 10^{-4}$ |

TABLE 5

| Sample No. | Isc | Voc | F.F | η (%) |
|---|---|---|---|---|
| PV-1 | 12 mA/cm$^2$ | 0.60 v | 0.55 | 4.0 |
| PV-2 | 19 mA/cm$^2$ | 0.93 v | 0.72 | 12.7 |
| PV-3 | 18 mA/cm$^2$ | 0.90 v | 0.70 | 11.3 |
| PV-4 | 17 mA/cm$^2$ | 0.85 v | 0.65 | 9.4 |
| PV-5 | 16 mA/cm$^2$ | 0.68 v | 0.60 | 6.2 |
| PV-6 | 15 mA/cm$^2$ | 0.65 v | 0.58 | 5.7 |
| PV-7 | 15 mA/cm$^2$ | 0.62 v | 0.57 | 5.3 |

TABLE 6

| Sample No. | Dark current | Photoelectric current | S/N ratio |
|---|---|---|---|
| PV-1 | 35 mA/cm$^2$ | 11 μA/cm$^2$ | $3.1 \times 10^2$ |
| PV-2 | 85 mA/cm$^2$ | 20 μA/cm$^2$ | $2.4 \times 10^5$ |
| PV-3 | 120 mA/cm$^2$ | 19 μA/cm$^2$ | $1.6 \times 10^5$ |
| PV-4 | 370 mA/cm$^2$ | 17 μA/cm$^2$ | $4.6 \times 10^4$ |
| PV-5 | 4.7 mA/cm$^2$ | 15 μA/cm$^2$ | $3.2 \times 10^3$ |
| PV-6 | 8.5 mA/cm$^2$ | 12 μA/cm$^2$ | $1.4 \times 10^3$ |
| PV-7 | 24 mA/cm$^2$ | 12 μA/cm$^2$ | $5.0 \times 10^2$ |

TABLE 7

|  | D |  | E |  |
|---|---|---|---|---|
| Inner pipe | SiF$_4$ | 30 SCCM | SiF$_4$ | 30 SCCM |
|  | C$_2$H$_4$ | 30 SCCM | C$_2$H$_4$ | 30 SCCM |
|  | BF$_3$ | 0.3 SCCM |  |  |
| Outer pipe | Ar | 250 SCCM | Ar | 250 SCCM |
|  | H$_2$ | 20 SCCM | H$_2$ | 20 SCCM |
| Inner pressure |  | 0.5 Torr |  | 0.5 Torr |
| Discharge power |  | 160 W (PV-8) |  | 160 W (PV-8) |
|  |  | 100 W (PV-9) |  | 100 W (PV-9) |
| Substrate temperature |  | 300° C. |  | 300° C. |

TABLE 8

| Sample No. | Microwave power (n-type) | Hydrogen concentration (n-type) | Microwave power (p-type) | Hydrogen concentration (p-type) | Isc | Voc | F.F | η | S/N ratio |
|---|---|---|---|---|---|---|---|---|---|
| PV-8 | 60 w | 2% | 160 w | 14% | 19 mA/cm$^2$ | 0.85 | 0.62 | 10.0% | 2.7 × 10$^4$ |
| PV-9 | 60 w | 2% | 100 w | 7% | 20 mA/cm$^2$ | 0.95 | 0.65 | 12.4% | 3.2 × 10$^5$ |

TABLE 9

| Sample No. | Microwave power (n-type) | Hydrogen concentration (n-type) | Isc | Voc | F.F | η | S/N ratio |
|---|---|---|---|---|---|---|---|
| PV-10 | 160 w | 15% | 12 mA/cm$^2$ | 0.42 | 0.60 | 3.0% | 6.4 × 10$^3$ |
| PV-11 | 60 w | 2% | 14 mA/cm$^2$ | 0.63 | 0.72 | 6.4% | 1.9 × 10$^5$ |

TABLE 10

| | F | G | H | I | J |
|---|---|---|---|---|---|
| Gas used and its flow rate | SiH$_4$ 10 SCCM<br>H$_2$ 40 SCCM<br>PH$_3$ 0.03 SCCM | SiH$_4$ 10 SCCM<br>H$_2$ 40 SCCM | SiH$_4$ 10 SCCM | SiH$_4$ 10 SCCM<br>H$_2$ 45 SCCM<br>BiH$_2$ 0.02 SCCM | SiH$_4$ 10 SCCM<br>H$_2$ 45 SCCM |
| Inner pressure | 0.5 Torr | 0.5 Torr | 0.5 Torr | 0.5 Torr | 0.5 Torr |
| Discharge power | 10 W (PV-12)<br>50 W (PV-13) | 10 W (PV-12)<br>50 W (PV-13) | 10 W (PV-12,PV-13) | 10 W (PV-12)<br>50 W (PV-13) | 10 W (PV-12)<br>50 W (PV-13) |
| Substrate temperature | 300° C. | 300° C. | 300° C. | 300° C. | 300° C. |

TABLE 11

| Sample No. | Discharge power (n-type) | Hydrogen concentration (n-type) | Discharge power (p-type) | Hydrogen concentration (p-type) | Isc | Voc | F.F | η | S/N ratio |
|---|---|---|---|---|---|---|---|---|---|
| PV-12 | 10 w | 15% | 10 w | 12% | 15 mA/cm$^2$ | 0.68 V | 0.55 | 5.6% | 9.3 × 10$^2$ |
| PV-13 | 50 w | 7% | 50 w | 6% | 16 mA/cm$^2$ | 0.88 V | 0.65 | 9.2% | 3.7 × 10$^4$ |

What we claim is:

1. An improved pin type film photoelectromotive force element comprising a p-type semiconductor layer, an i-type semiconductor layer and an n-type semiconductor layer which has enhanced short-circuit current, open-circuit voltage, fill factor, S/N ratio and photoelectric conversion efficiency, characterized in that said p-type semiconductor layer contains 1 to 10 atomic % of hydrogen atoms and comprises a plurality of an alternating stack of (i) a p-type amorphous silicon film 100Å or less thick containing 1 to 10 atomic % of hydrogen atoms and a p-type impurity and (ii) a non-doped amorphous silicon film 100 Å or less thick containing 1 to 10 atomic % of hydrogen atoms; said i-type semiconductor layer comprises a non-doped amorphous silicon film containing 1 to 10 atomic % of hydrogen atoms; and said n-type semiconductor layer contains 1 to 10 atomic % of hydrogen atoms and comprises a plurality of an alternating stack of (iii) an n-type amorphous silicon film 100 Å or less thick containing 1 to 10 atomic % of hydrogen atoms, and an n-type impurity and (iv) a non-doped amorphous silicon film 100 Å or less thick containing 1 to 10 atomic % of hydrogen atoms.

* * * * *

UNITED STATES PATENT AND TRADEMARK OFFICE
CERTIFICATE OF CORRECTION

PATENT NO. : 4,946,514

DATED : August 7, 1990

INVENTOR(S) : KATSUMI NAKAGAWA, ET AL.

It is certified that error appears in the above-identified patent and that said Letters Patent is hereby corrected as shown below:

ON THE TITLE PAGE,
IN [56] REFERENCES CITED

OTHER PUBLICATIONS, "Amorphons" should read --Amorphous--.

ON THE TITLE PAGE,
IN [57] ABSTRACT

Line 1, "Schottky time" should read --Schottky type--.

COLUMN 1

Line 45, "p type" should read --p-type--.
    Line 54, "A Si:H" should read --A-Si:H--.
    Line 58, "50 Å A thick" should read --50 Å thick--.
    Line 63, "A Si:H" should read --A-Si:H--.

COLUMN 2

Line 36, "non single crystal" should read --non-single-crystal--.
    Line 50, "ration" should read --ratio--.
    Line 55, "non-single crystal" should read --non-single-crystal--.

COLUMN 5

Line 59, "circuit" should read --circuit.--.

COLUMN 6

Line 31, "changed" should read --changed.--.

UNITED STATES PATENT AND TRADEMARK OFFICE
CERTIFICATE OF CORRECTION

PATENT NO. : 4,946,514
DATED : August 7, 1990
INVENTOR(S) : KATSUMI NAKAGAWA, ET AL.

It is certified that error appears in the above-identified patent and that said Letters Patent is hereby corrected as shown below:

COLUMN 7

Line 19, "dark, $^{94}$ d." should read --dark $\sigma_d$.--.

COLUMN 9

Line 60, "Tho" should read --The--.

COLUMN 10

Line 2, "(S/N)" should read --(S/N).--.

Signed and Sealed this

Sixteenth Day of June, 1992

Attest:

DOUGLAS B. COMER

Attesting Officer     Acting Commissioner of Patents and Trademarks